United States Patent [19]

Suzuki et al.

[11] 4,079,506

[45] Mar. 21, 1978

[54] METHOD OF PREPARING A DIELECTRIC-ISOLATED SUBSTRATE FOR SEMICONDUCTOR INTEGRATED CIRCUITRIES

[75] Inventors: Takaya Suzuki; Seturoo Yagyuu; Akio Mimura, all of Hitachi, Japan

[73] Assignee: Hitachi, Ltd., Japan

[21] Appl. No.: 637,959

[22] Filed: Dec. 5, 1975

[30] Foreign Application Priority Data

Dec. 11, 1974 Japan .................................. 49-141555

[51] Int. Cl.² .................... H01L 21/304; H01L 21/316
[52] U.S. Cl. .................................... 29/576 W; 427/93; 427/95; 357/49; 357/59; 156/649; 148/33.3
[58] Field of Search ............... 29/576 IW; 357/59, 49; 156/17, 649; 427/93, 95; 148/33.3

[56] References Cited

U.S. PATENT DOCUMENTS

| 3,331,716 | 7/1967 | Bloem et al. .......................... 148/174 |
| 3,368,113 | 2/1968 | Shaunfield .............................. 357/49 |
| 3,411,200 | 11/1968 | Formigoni ............................. 29/580 |
| 3,423,255 | 1/1969 | Joyce ..................................... 148/175 |
| 3,574,007 | 4/1971 | Hugle ..................................... 148/175 |
| 3,575,731 | 4/1971 | Hoshi et al. ........................... 148/175 |
| 3,624,463 | 11/1971 | Davidsohn .............................. 29/576 |
| 3,829,889 | 8/1974 | Allison et al. .......................... 357/49 |

OTHER PUBLICATIONS

Davidsohn et al., "Dielectric Isolated . . . Processes", Proc. IEEE, 9-1969, pp. 1532-1537.
Seto, IBM Tech. Dis. Bull., "Two Level . . . Circuits", vol. 9, No. 6 (11-1966) pp. 579-580.
Steinmaier et al., "Sucessive . . . Apparatus, J. Electrochemical Society, vol. 111, No. 2 (2-1964) pp. 206-209.

*Primary Examiner*—John T. Goolkasian
*Attorney, Agent, or Firm*—Craig & Antonelli

[57] ABSTRACT

In the preparation of a dielectric-isolated substrate for semiconductor integrated circuits which comprises a plurality of silicon single crystalline islands in which circuit elements are formed, a region made of an alternate laminate of silicon polycrystalline layers and silicon oxide films for supporting the plurality of silicon single crystalline islands, and a silicon oxide film interposed between the silicon single crystalline islands and the support region for isolating each of the silicon single crystalline islands from the remaining ones and the support region, the formation of three to twelve silicon polycrystalline layers in the support region can remarkably reduce the bending of the substrate resulting from the growth stress of the silicon polycrystalline layers or from the difference in thermal expansion coefficients between the single crystalline silicon and the polycrystalline silicon, and therefore produces a dielectric-isolated substrate showing little bending.

9 Claims, 13 Drawing Figures

METHOD OF PREPARING A DIELECTRIC-ISOLATED SUBSTRATE FOR SEMICONDUCTOR INTEGRATED CIRCUITRIES

BACKGROUND OF THE INVENTION

This invention relates to a method of preparing a substrate, in which active single-crystal-regions are partitioned with dielectric insulators (hereinafter referred to as dielectric-isolated substrate), required for constituting monolithic semiconductor integrated circuitries.

The dielectric-isolated substrate comprises a large number of silicon single crystalline islands secured to a silicon polycrystalline support region by way of a dielectric insulator film of silicon oxide. Thus, mechanical integrations between individual silicon single crystalline islands and between the silicon polycrystalline support region and individual silicon single crystalline islands are assured, and these elements are electrically isolated.

Such circuit elements as transistors, diodes resistors, capacitors are incorporated into the numerous silicon single crystalline islands by diffusion techniques and interconnected with each other to form a monolithic semiconductor integrated circuit.

DESCRIPTION OF THE PRIOR ART

A typical prior art process for the preparation of a dielectric-isolated substrate will be described with reference to FIGS. 1a to 1d.

One surface of a silicon single crystalline wafer 1 as shown in FIG. 1a is formed with grooves 2 in spaced relationship by selective etching and coated with an $SiO_2$ film 3 for insulation purposes, as shown in FIG. 1b. On the $SiO_2$ film 3 there is formed a silicon polycrystalline layer 4 by a vapor phase reaction of silicon chloride, as shown in FIG. 1c. Then, the opposite surface of the single crystalline wafer is polished up to a level designated by the chained line thereby to produce a substrate 7 with single crystalline island regions 6 partitioned from each other by way of the silicon dioxide film 3, as shown in FIG. 1d. By diffusing desired impurities into the substrate 7 through known selective diffusion, circuit elements can be produced.

However, the aforementioned prior art process for a preparation of the dielectric-isolated substrate encounters a fatal problem that the substrate 7 is shaped with a curvature after the step for the preparation of polycrystalline layer as shown in FIG. 1c. This problem may result from (1) the difference in thermal expansion coefficients between the silicon single crystalline wafer and the silicon polycrystalline layer and (2) contraction due to the recrystallization of the polycrystalline layer per se during its growth. Specifically, the polycrystalline layer will yield to assume a concave configuration. The substrate 7 with resultant curvatures prevents the single crystalline wafer from being polished uniformly in the subsequent polishing process with the result that a photoresist mask to be used for the selective diffusion will not be brought into intimate contact with the polished surface of the single crystalline wafer.

SUMMARY OF THE INVENTION

Therefore, an object of this invention is to provide a method of preparing a substrate for semiconductor integrated circuitries with fine structure capable of being produced with high precision through mass production.

Another object of this invention is to provide a method of preparing a substrate for semiconductor integrated circuits which has less curvature and can be subjected to a precise lapping and polishing operations and precise photo-etching operation as well.

To attain the above objects, according to the invention, there is provided a method of preparing a dielectric-isolated substrate for semiconductor integrated circuits which comprises a plurality of silicon single crystalline islands provided for circuit elements formed therein, a support region of an alternate multiple layer structure of silicon polycrystalline layers and silicon oxide films for supporting the plurality of silicon single crystalline islands, and a dielectric film for effecting electrical isolation between said single crystalline islands and between said support region and single crystalline islands, wherein the number of said polycrystalline layers is determined to be 3 to 12 for preparing the support region. In more detail, one surface of a silicon single crystalline wafer is formed with grooves in spaced-apart relationship, and silicon oxide films and silicon polycrystalline layers having respectively a thermal expansion coefficient less than and larger than that of the silicon single crystalline wafer are alternately stacked on the silicon single crystalline wafer thereby to produce a support region of a multiple layer structure which will not yield or bend. By adding at a specified time interval such oxidizing gases as carbon dioxide gas, oxygen and water vapor to a reaction gas which is created when silicon chloride, for example trichlorosilane ($SiHCl_3$), is reacted with hydrogen under a vapor phase reductive reaction to deposit silicon polycrystals, the multiple layer structure can be prepared easily and continuously, i.e., without pulling out the single crystalline wafer from a reaction furnace in the course of the reaction. When producing the support region of multiple layer structure based on the essential technique as described above, the degree and direction of curvature can be controlled by selecting the number of the polycrystalline layers so that it is possible to prepare a substrate which is considered to be of no curvature for practical purposes. Specifically, when the number of the polycrystalline layers is selected to be 3 to 12, the substrate can almost be free from yielding with a curvature.

BRIEF DESCRIPTION OF THE DRAWINGS

The invention can be more fully understood from the following detailed description taken in conjunction with the accompanying drawings in which.

DETAILED DESCRIPTION OF THE INVENTION

Figure 1A:
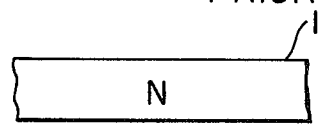
FIGS. 1a to 1d are sectional views sequentially showing steps of a prior art process for the preparation of a dielectric-isolated substrate.
Figure 1B:
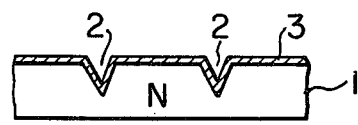
Figure 1C:
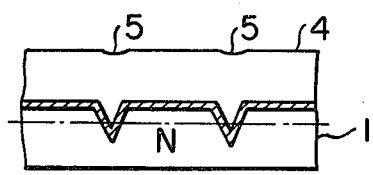
Figure 1D:
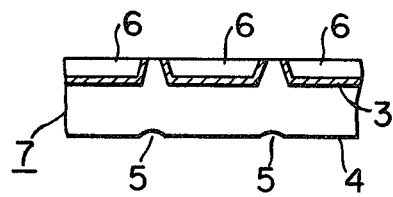
Figure 2A:
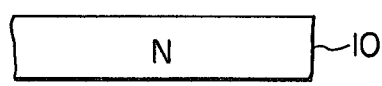
FIGS. 2a to 2d are sectional views sequentially showing steps of a process for the preparation of a dielectric-isolated substrate according to the invention.
Figure 2B:
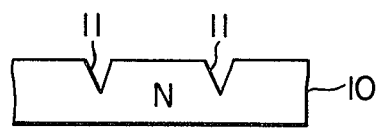

A silicon single crystalline wafer 10, of 300 ± 100 μ thickness and (100) plane orientation, with parallel surfaces ground and polished as shown in FIG. 2a is formed with grooves 11 in spaced relationship by selective etching as well known in the art, as shown in FIG. 2b. The single crystalline wafer 10 formed with the spaced grooves 11 is placed in a reaction furnace used for a typical epitaxial growth operation, and is provided with a deposited silicon oxide film 12, having a thickness of 1.5μ at a high temperature from 1100° C to 1250° C in the atmosphere of flowing mixture gas containing trichlorosilane ($SiHCl_3$), hydrogen and carbon dioxide gas ($CO_2$). The deposition of a first polycrystalline layer 13a about 45 μ in thickness follows when a mixture gas containing trichlorosilane and hydrogen continues to flow but carbon dioxide gas stops flowing while maintaining the reaction temperature. Then, by introducing carbon dioxide gas into the reaction system again while continuing to supply trichlorosilane and hydrogen, a silicon oxide film 14a is formed, about 0.3 to 2 μ in thickness, on the first polycrystalline layer 13a. In this manner, silicon oxide films 14a to 14m and silicon polycrystalline layers 13a to 13n are stacked alternately provided that the flow rate of hydrogen gas and carbon dioxide gas to be mixed with trichlorosilane is regulated in accordance with the steps of the reaction. The reaction temperature is kept unchanged. After the silicon oxide film 14a is formed, the introduction of carbon dioxide gas into the reaction system is stopped again and the flow rate of trichlorosilane and hydrogen is returned to that for the formation of silicon polycrystalline layer 13a thereby to form a second silicon polycrystalline layer 13b about 45 μ in thickness. By repeating these steps, a third, fourth and fifth silicon polycrystalline layers each about 45 μ in thickness and silicon oxide films each 0.3 to 2 μ in thickness are formed alternately, resulting in a support region 15 of a multiple layer structure about 230 μ in thickness consisting of silicon polycrystalline layers and silicon oxide films.

In forming the support region 15 of multiple layer structure, silicon chlorides other than the trichlorosilane such as silicon tetrachloride ($SiCl_4$) or dichlorosilane ($SiH_2Cl_2$), or monosilane ($SiH_4$) may be used as a source of silicon, and oxidizing gases such as water vapor, oxygen and nitrogen dioxide may be used instead of the carbon dioxide gas. This technique is detailed in the specification of U.S. Patent Application Ser. No. 531,167 of the same applicant, "Process for producing dielectric-isolated substrate for monolithic semiconductor integrated circuits", filed on Dec. 9, 1974.

A substrate 16 with the multiple layer support region 15 of a quintuple polycrystalline layer thus produced has a radius of curvature ranging from 10 meters to 100 meters, and markedly reduces the curvature when compared with a radius of curvature from 3 meters to 5 meters of a substrate with the prior art monolayer polycrystalline support region, as shown in FIG. 1 of the same thickness as that of the multiple layer polycrystalline support region.

The magnitude and direction of curvature of the substrate 16 with the multiple structure support region can be controlled by the number of the silicon polycrystalline layers.

Figure 3:
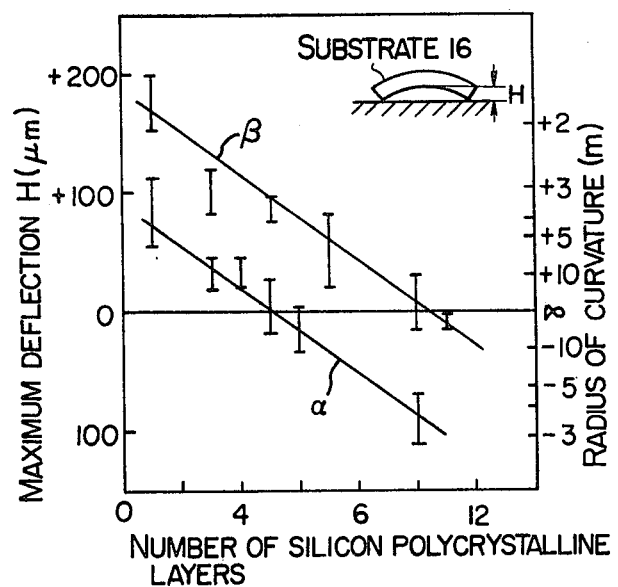
FIG. 3 is a graphic representation of experimental results showing a relation between the number of silicon polycrystalline layers of a multiple layer support region and a curvature of the substrate.
Figure 4:
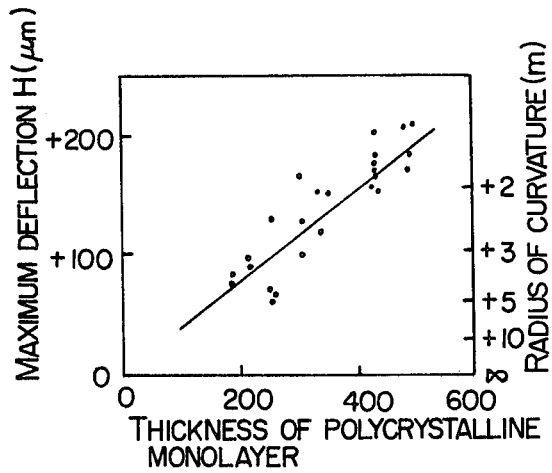
FIG. 4 is a graphic representation showing a relation between the thickness of a polycrystalline support region of a monolayer structure and a curvature of the substrate.

FIG. 3 is one example of experimental results showing a relation between the multiple structure and the curvature of substrate. The magnitude of curvature is represented by a maximum deflection H and a radius of curvature when a substrate is of 50 millimeters in diameter, where the plus sign corresponds to a concave curvature of the support region (accordingly, a convex curvature of the single crystalline wafer) and the minus sign corresponds to a convex curvature of the support region. Curve α corresponds to measured values for a support region of a total thickness from 210 μ to 260 μ and curve β corresponds to measured values for a support region of a total thickness from 430 μ to 480 μ. As the number of silicon polycrystalline layers increases, the direction of curvature is inverted so that the silicon polycrystalline support region begins to yield to take the form of a convex surface. In this manner, with the support region of the multiple layer structure, the magnitude and direction of the curvature of the substrate can optionally be controlled by the number of the multiple layers with high reproducibility. It should be noted that the relation between the number of silicon polycrystalline layers and the curvature of substrate depends on the total thickness of the support region. FIG. 4 shows the relation based on measured values between the thickness of the polycrystalline support region of monolayer structure and the curvature of substrate. Plus sign values on the ordinate indicate that the polycrystalline support region yields with a concave curvature as in FIG. 3. The thicker the polycrystalline support region, becomes the larger is the curvature of substrate.

It will be seen from FIGS. 3 and 4 and other experimental results that when a multiple layer polycrystalline support region consisting of silicon polycrystalline support region consisting of silicon polycrystalline layers and silicon oxide films is formed, in about 200 to 500 μ thickness, on a 300 ± 100 μ thickness single crystalline wafer with (100) plane orientation at 1100° C to 1250° C growth temperatures, the relation between the curvature of substrate and the number of silicon polycrystalline layers can be approximated by the following experimental equation, $$H \simeq A \cdot n + B \qquad (1)$$

where H represents the maximum deflection (micron) for a 50 mm diameter substrate, n (positive integer) the number of silicon polycrystalline layers, and A and B constants.

Figure 5:
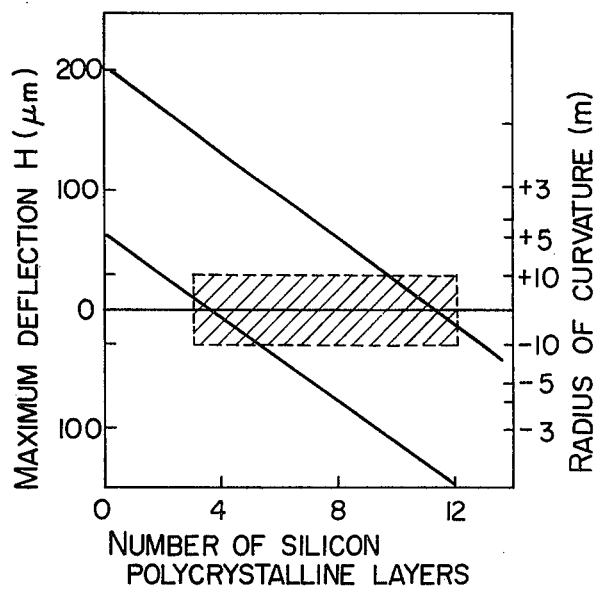
FIG. 5 is a graphic representation useful to explain how to determine the number of the layers of multiple layer structure capable of producing a substrate of less curvature, i.e., of a radius of curvature more than about 10 meters.

In general, the curvature of the substrate with the multiple layer structure depends on the number of silicon polycrystalline layers and the thickness thereof to a great extent, as described above. Other parameters which have an influence on the magnitude of curvature are the thickess of the single crystalline wafer, the plane orientation thereof, the growth temperature of the silicon polycrystalline layer, the growth rate thereof, and the thickness of the silicon oxide film. Among them, the plane orientation of the single crystalline wafer and the thickness of the silicon oxide film have a comparatively small influence on the curvature so that their influence may be almost negligible. It was proved that such parameters as the thickness of single crystalline wafer, the growth temperature of silicon polycrystalline layer and the growth rate thereof mainly influence the constant B of equation (1) but have little influence on the constant A. Experimental results showed that under the condition that the thickness of single crystalline wafer is 300 ± 100 μ, the thickness of support region is 200 μ to 500 μ, the growth temperature of polycrystal is 1100° C to 1250° C and the growth rate is 1 to 8 μ/min., then A ≃ − 18 (μ/one layer) and B ≃ 60 ∼ 200 (microns). It will be seen from these experimental results that the number of the silicon polycrystalline layers in the multiple layer structure may preferably be 3 to 12 under the above conditions in order to prepare a substrate of less curvature having a radius of curvature more than 10 meters which is satisfactory for practical purposes, as confined within the hatched area of FIG. 5.

In most practical production procedures of the dielectric-isolated substrate, a single crystalline wafer of 40 mm to 90 mm diameter and of 200 μ to 400 μ thickness is used as a raw crystal and a silicon polycrystalline layer is grown at 1100° C to 1250° C temperatures and 1 μ to 8 μ/min. rates. Therefore, the previously mentioned conditions are satisfactory for practical purposes.

Figure 2C:
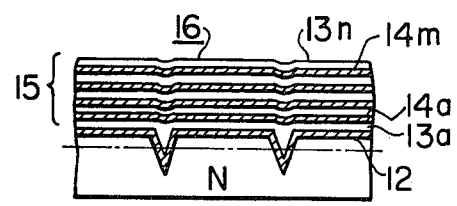
Figure 2D:
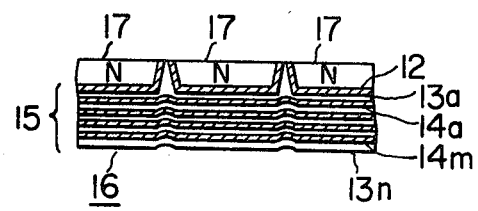

By removing the single crystalline wafer 10 coated with the support region 15 of multiple layer structure, prepared in this manner, by means of lapping and mirror polishing up to a level designated by the chained line shown in FIG. 2c, the dielectric-isolated substrate with single crystalline island regions 17 is produced. The substrate 16 formed with the polycrystalline support region 15 has substantially no curvature so that the previously mentioned polishing operation is performed with high uniformity and precision as compared with the prior art operation, thereby markedly improving the yield rate of the products.

In individual single crystalline island regions 17 of the dielectric-isolated substrate 16 thus prepared, there may be formed through the well-known selective diffusion such circuit elements as transistors, diodes, resistors and capacitors with high precision.

In the prior art method in which the substrate is formed with a polycrystalline monolayer, the silicon polycrystalline layer is forced to yield with a concave curvature since the silicon polycrystalline layer has a larger thermal expansion coefficient of 7.6 × 10$^{-6}$°C$^{-1}$ than that of the silicon single crystalline wafer of 2.5 × 10$^{-6}$°C$^{-1}$. In addition, it is considered that while growing by a vapor phase reaction at a high temperature, a silicon polycrystal per se undergoes a slight contraction due to the rearrangement of atoms. Therefore, this phenomenon is likely to give rise to a concave curvature of the polycrystalline layer of the substrate when the support region is made from the polycrystalline monolayer. A radius of such concave curvature is usually smaller than about 5 ∼ 7 meters, although depending on the conditions for the growth of silicon polycrystalline layer. On the other hand, when the support region 15 takes the form of a multiple layer structure consisting of silicon polycrystalline layers and silicon oxide films, the silicon oxide films will act against a force responsible for causing the concave curvature of the polycrystalline layer to cancel the curvature so that the radius of curvature of the substrate can controllably be magnified up to more than 10 meters, thereby the degree of curvature being extremely reduced. This effect of the invention may result from the fact that the silicon oxide film has a far smaller thermal expansion coefficient of 0.5 × 10$^{-6}$ °C$^{-1}$ than that of a silicon single crystal and when the silicon oxide film is being formed, oxygen prevailing along grain boundaries within the silicon polycrystalline layer will intrude or diffuse into the grain boundaries to create an oxidized surface of the grain boundaries or a deposit of silicon oxide which is effective to extend the polycrystalline layer or to prevent the contraction of the same.

Figure 6:
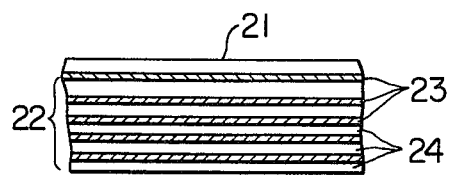
FIG. 6 is a sectional view of another embodiment of the invention.
Figure 7:
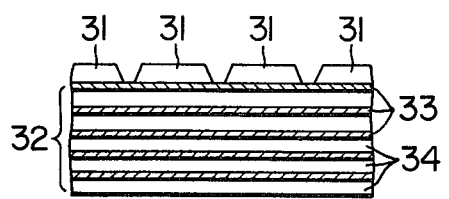
FIG. 7 is a sectional view of still another embodiment of the invention.

Although being described in terms of the formation of multiple layer polycrystalline support region for supporting a dielectric-isolated substrate, the invention is not limited to the preparation of the dielectric-isolated substrate alone. Obviously, the invention is widely applicable to the preparation of semiconductor substrates which require a polycrystalline support region. Exemplarily, a support region 22 for supporting a thin film silicon single crystalline layer 21 is illustrated in FIG. 6, which support region consists of silicon oxide films 23 and polycrystalline layers 24. Further, in the embodiment shown in FIG. 7, a large number of silicon single crystalline wafers are supported by a support region 32 which consists of silicon oxide films 33 and silicon polycrystalline layers 34.

What is claimed is:

1. A method of manufacturing a dielectric-isolated substrate for semiconductor integrated circuits consisting of:
    (a) forming spaced-apart grooves in one principal plane surface of a silicon single crystalline wafer;
    (b) forming a dielectric film on the one principal plane surface of said silicon single crystalline wafer having said spaced-apart grooves formed therein;
    (c) forming on said dielectric film a support region made of an alternate multiple layer structure of n silicon polycrystalline layers each having the same thickness and n-1 silicon oxide layers each having the same thickness, where n is an integer from 3 to 12 inclusive;
    (d) removing material from the opposite principal plane surface of the silicon single crystalline wafer until said spaced-apart grooves are exposed and plural single crystalline islands isolated by said dielectric film are formed;
    whereby support for the dielectric-isolated regions is provided entirely by the alternate multiple layer structure of said support region with substantially no curvature.

2. A method according to claim 1, wherein said silicon single crystalline wafer is 300 ± 100 μ in thickness, said support region is 200 μ to 500 μ in thickness, said silicon polycrystalline layers and silicon oxide films constituting said support region undergo vapor phase growth at temperatures from 1100° C to 1250° C and at growth rate for the silicon polycrystalline layers of 1 to 8 μ/min.

3. A method according to claim 2, wherein for a substrate 50 mm in diameter, the number $n$ of silicon polycrystalline layers is determined by the following equation:

$$H \simeq A \cdot n + B,$$

where H represents a permissible maximum deflection, A a constant defined by A≃− 18 (μ/one layer) and B a constant defined by B≃60 to 200(μ).

4. A method according to claim 1, wherein each of silicon polycrystalline layers of said support region is about 45 μ in thickness, and each of silicon oxide films is 0.3 μ to 2 μ in thickness.

5. A method of preparing a dielectric-isolated substrate for semiconductor integrated circuitries consisting of:
   forming spaced grooves in one principal plane surface of a silicon single crystalline wafer;
   forming a dielectric film on the one principal plane surface of the silicon single crystalline wafer formed with the spaced grooves;
   forming on the dielectric film a support region of an alternate multiple layer structure of silicon oxide films and silicon polycrystalline layers, of equal thickness the number of said silicon polycrystalline layers being 3 to 12;
   polishing the opposite principal plane surface of the silicon single crystalline wafer until the spaced grooves are exposed to the outside and numerous silicon single crystalline islands isolated with the dielectric film are formed.

6. A method of preparing a dielectric-isolated substrate for semiconductor integrated circuitries according to claim 2, wherein said silicon single crystalline wafer is 300 ± 100 $\mu$ in thickness, said support region is 200 $\mu$ to 500 $\mu$ in thickness, said silicon polycrystalline layers and silicon oxide films constituting said support region undergo vapor phase growth at temperatures from 1100° C to 1250° C and at growth rate for the silicon polycrystalline layers of 1 to 8 $\mu$/min.

7. A method of preparing a dielectric-isolated substrate for semiconductor integrated circuitries according to claim 3, wherein for a substrate 50 mm in diameter, the number n of silicon polycrystalline layers is determined by the following equation:

$$H \simeq A \cdot n + B,$$

where H represents a permissible maximum deflection, A a constant defined by $A \simeq -18$ ($\mu$/one layer) and B a constant defined by $B \simeq 60$ to $200$ ($\mu$).

8. A method of preparing a dielectric-isolated substrate for semiconductor integrated circuitries according to claim 2, wherein each of silicon polycrystalline layers of said support region is about 45 $\mu$ in thickness, and each of silicon oxide films is 0.3 $\mu$ to 2 $\mu$ in thickness.

9. A method of preparing a dielectric-isolated substrate for semiconductor integrated circuitries which substrate comprises a plurality of silicon single crystalline islands provided for circuit elements formed therein, a support region of an alternate multiple layer structure of silicon polycrystalline layers and silicon oxide films for supporting the plurality of silicon single crystalline islands, and a dielectric film for effecting electrical isolation between said single crystalline islands and between said support region and single crystalline islands, wherein said method consists of
   growing silicon as polycrystalline silicon by heating a derivative of monosilane having a chemical composition of $SiH_mCl_n$ in an atmosphere of hydrogen wherein $0 \leq m \leq 3$ and $1 \leq n \leq 4$, and
   growing silicon oxide by heating said derivative of monosilane in a mixed gas of hydrogen and oxygen, said first and second steps being conducted alternately and repeatedly at the same temperature for vapor growth in the same reactor vessel for vapor growth to form said support region, the number of silicon polycrystalline layers included in said support region lying in a range of 3 to 12 inclusive, each of said polycrystalline layers having the same thickness.

* * * * *